United States Patent [19]

Korom

[11] 3,780,319

[45] Dec. 18, 1973

[54] BISTABLE MULTIVIBRATOR

[75] Inventor: Arpad Korom, Zurich, Switzerland

[73] Assignee: U.S. Philips Corporation, New York, N.Y.

[22] Filed: Sept. 20, 1972

[21] Appl. No.: 290,649

[30] Foreign Application Priority Data

Sept. 30, 1971 Netherlands ........................ 7113388

[52] U.S. Cl. ............. 307/288, 307/291, 307/299 A, 307/303

[51] Int. Cl. ............................................ H03k 3/286

[58] Field of Search .................... 307/213, 240, 241, 307/242, 288, 289, 291, 292, 299 A, 303

[56] References Cited

UNITED STATES PATENTS

| | | | |
|---|---|---|---|
| 3,047,737 | 7/1962 | Kolodin | 307/292 X |
| 3,093,750 | 6/1963 | Brauer | 307/291 X |
| 3,584,311 | 6/1971 | Schaffer | 307/288 X |
| 3,617,778 | 11/1971 | Korom | 307/288 X |
| 3,621,303 | 11/1971 | Fonjallaz | 307/292 |
| 3,678,300 | 7/1972 | Keller | 307/288 |

*Primary Examiner*—John W. Huckert
*Assistant Examiner*—L. N. Anagnos
*Attorney*—Frank R. Trifari

[57] ABSTRACT

Bistable multivibrator comprising two stages. Each stage comprises a switching transistor and a control transistor the collector emitter paths of which are connected in parallel. The bases and the collectors of the switching transistors of the two stages are cross coupled, and a trigger signal is applied to the bases of the two control transistors via two capacitive elements. The collector base path of each of the two control transistors is shunted by the emitter collector path of an auxiliary transistor of opposite conductivity type the base of which is connected to the trigger input. This provides a highly stable circuit, whilst in addition when the circuit is in integrated circuit form the surface area required for the capacitive elements is a minimum.

4 Claims, 4 Drawing Figures

BISTABLE MULTIVIBRATOR

Figure 1:
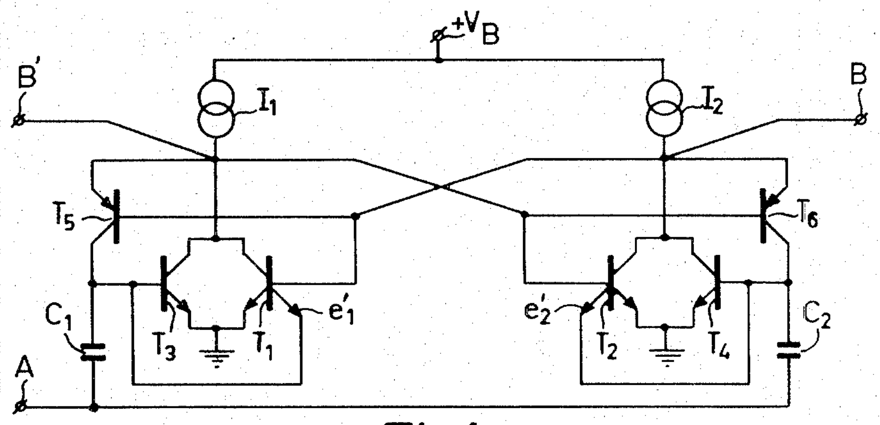

The invention relates to a bistable multivibrator which comprises two stages which each are provided with a switching transistor and a control transistor which are of the same conductivity type and the collector emitter paths of which are connected in parallel, the base of the control transistor of each of the two stages being connected to a common trigger input of the multivibrator via a capacitive element, whilst the base of the switching transistor of each stage is connected to the collector of the switching transistor of the other stage, the collector base path of the control transistor of each of the two stages being shunted by a shunt circuit which includes the emitter collector path of an auxiliary transistor of a conductivity type opposite to that of the switching and control transistors.

A bistable multivibrator of the said type is described, for example, in the periodical "Radiomentor," July 1971, page 423. Generally trigger pulses are applied to the trigger inputs of such multivibrators, the state of the multivibrator being required, for example, to be changed each time the leading edge of the trigger pulse appears. To obtain this desired change of state of the multivibrator the latter has to be prepared, i.e., even before the trigger pulse appears the base voltage of the control transistor of the cut-off stage must be brought to a value such that on the appearance of the trigger pulse this transistor becomes highly conducting, causing the multivibrator to change state. In the known multivibrator this is achieved in that the base of the auxiliary transistor in each of the two stages is connected to the collectors of the control and switching transistors of the other stage. As a result, the auxiliary transistor in the cut-off stage is conducting, because its emitter base voltage is equal to the base emitter voltage of the switching transistor which is conducting. Consequently the collector voltage of the said auxiliary transistor and hence the base voltage of the control transistor in this stage are approximately equal to the base voltage of the conducting switching transistor of the other stage. Thus, in the interval between two trigger pulses, in which interval the voltage at the trigger input is low (for example 0 volts), the capacitive element connected to the base of this control transistor is charged to this voltage value. As a result, on the appearance of the trigger pulse the voltage at the base of the said control transistor will abruptly jump to a much higher value, causing this transistor to become highly conducting and a change of state of the multivibrator to be initiated.

This known multivibrator circuit has the disadvantage that under certain unfavourable conditions (worst-cast condition), i.e., at certain values of the parameters of the elements used, its stability leaves to be desired. This is due to the fact that in either stage of the multivibrator the base emitter voltage of one of the control transistors already is approximately equal to the base emitter voltage of the conducting switching transistor. As a result, however, even small interference signals are sufficient to render this control transistor conducting and to cause an undesired change of state of the multivibrator.

A second disadvantage is that when a trigger pulse appears the trigger current is partly conducted away via the collector base junction of the auxiliary transistor, impairing the required amplitude of the trigger pulse.

When the multivibrator circuit is to be made in integrated circuit form, the presence of the capacitive elements is a disadvantage. These elements may be made in integrated circuit form, it is true, by designing them as pn junctions in a semiconductor element, however, in this known multivibrator circuit they occupy a considerable area of the semiconductor wafer.

It is an object of the invention to provide a bistable multivibrator of the type described in which the aforementioned disadvantages are largely eliminated.

The invention is characterized in that the base of each of the two auxiliary transistors is connected to the trigger input of the multivibrator.

A first feature of the multivibrator circuit according to the invention is that its stability is better than that of the known circuit. This is achieved by the different connection of the auxiliary transistors, in particular the different connection of the bases of these transistors, for these bases are connected to the trigger input, so that during the trigger pulse both auxiliary transistors are cut off, whereas in the known multivibrator circuit the auxiliary transistor in the cutoff stage was conducting.

As has been mentioned hereinbefore, the emitter voltage of the auxiliary transistor in the cut-off stage corresponds, to a good approximation, to the base voltage of the conducting switching transistor. Because in the circuit according to the invention the base of this auxiliary transistor is connected to the trigger input, which is at a positive voltage during the trigger pulse, the emitter base voltage of this auxiliary transistor is too small to render this transistor conducting. This means, however, that the collector voltage of this auxiliary transistor and hence the base voltage of the control transistor in this stage also is low, that is to say substantially 0 volts. Consequently during a trigger pulse the base voltages of the two control transistors are approximately 0 volts, so that interference signals have substantially no influence and an undesired change of state of the multivibrator is avoided with certainty.

A second advantage of the multivibrator circuit according to the invention is due to the fact that the leakage of current via the collector base path of the auxiliary transistor which occurs in the known circuit cannot occur. Consequently the capacitive elements may have lower values, and this is a large advantage when the circuit is to be made in integrated circuit form.

When the circuit is to be made by integrated circuit techniques, the invention provides a further advantage. In a preferred embodiment of the circuit in an integrated circuit form each of the auxiliary transistors is located, together with the capacitive element connected in parallel with its base collector path, in one semiconductor island, the capacitive element being produced by performing an additional diffusion of the same type as the base diffusion of the auxiliary transistor, which is in the form of a lateral transistor, this additional diffusion being more highly doped than the said base diffusion and extending both in part of the base region and in part of the collector region of the auxiliary transistor.

This possibility of providing the capacitive elements in integrated circuit form is a direct consequence of the structure of the multivibrator circuit according to the invention and has the advantage that the semiconductor area required for these capacitive elements is considerably reduced.

In a further embodiment both auxiliary transistors may even be located together with the two capacitive elements in a single semiconductor island, the additional diffusion extending in the collector and base regions of both auxiliary transistors, resulting in a very compact structure of the integrated circuit.

Figure 2:
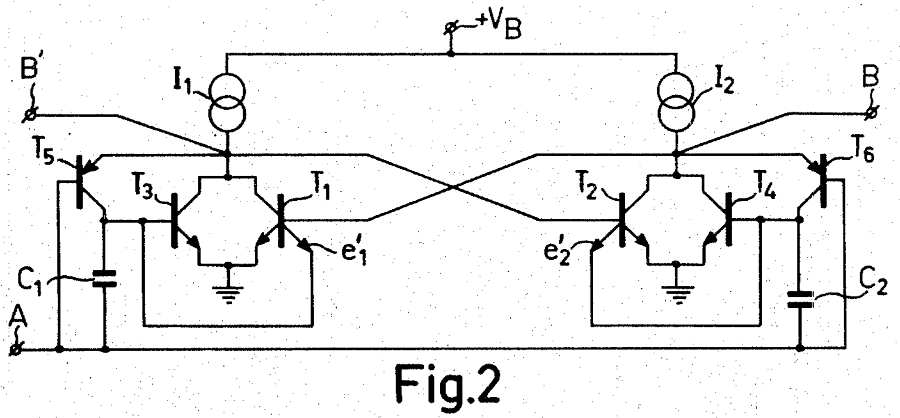
Figure 3:
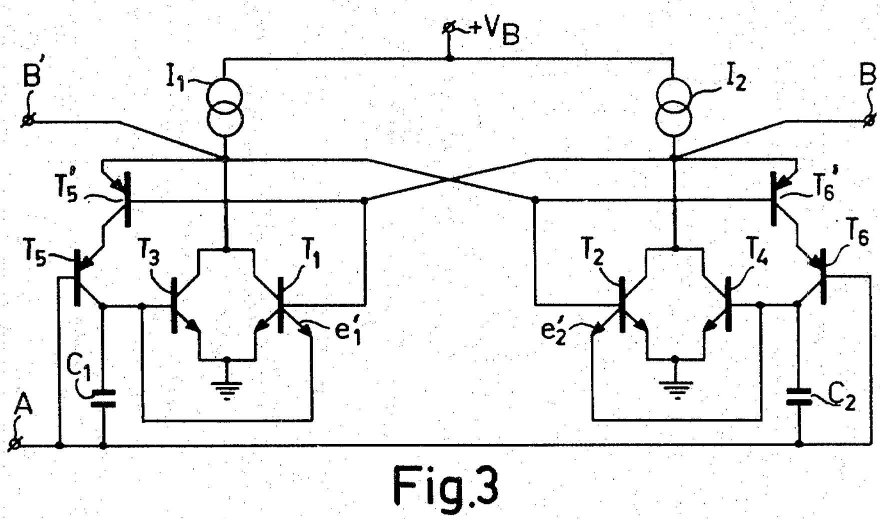
Figure 4:
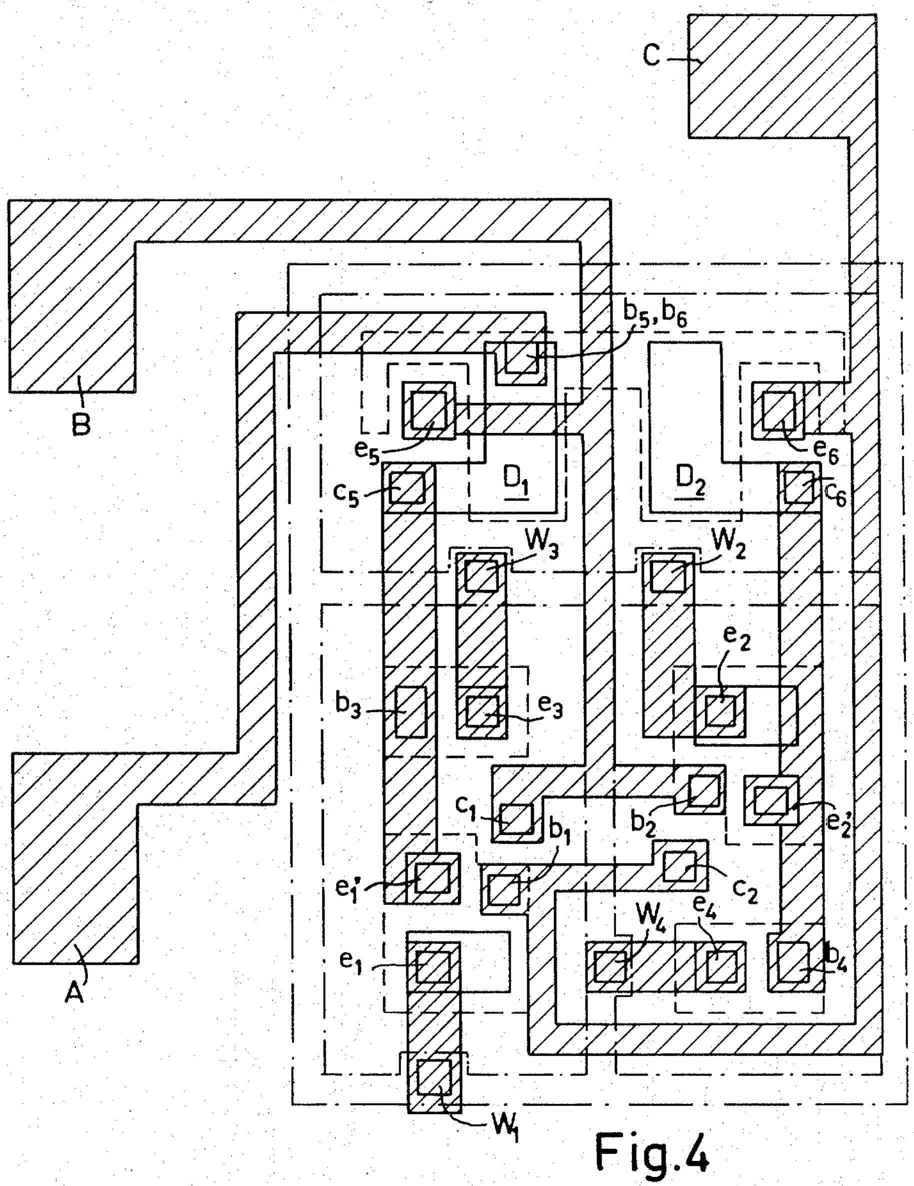

Embodiments of the invention will now be described, by way of example, with reference to the accompanying diagrammatic drawings, in which:

FIG. 1 shows the multivibrator circuit described in the aforementioned publication, FIGS. 2 and 3 each show an embodiment of the multivibrator circuit according to the invention, and FIG. 4 shows an embodiment of the circuit of FIG. 2 in integrated circuit form.

Referring now to FIG. 1, the known multivibrator circuit comprises a first stage including transistors $T_1$, $T_3$ and $T_5$ and a second stage including transistors $T_2$, $T_4$ and $T_6$, the transistors $T_1$, $T_2$, $T_3$ and $T_4$ being of the npn type and the transistors $T_5$ and $T_6$ being of the pnp type. The collector emitter paths of the transistors $T_1$ and $T_3$ are connected in parallel, as are the collector emitter paths of the transistors $T_2$ and $T_4$. Furthermore the collectors of the transistors $T_1$ and $T_3$ are connected via a current source $I_1$ to the positive terminal $+V_B$ of a voltage supply source to which the collectors of the transistor $T_2$ and $T_4$ are connected via a current source $I_2$, the emitters of these transistors being connected to the other terminal of this voltage supply source, for example to earth. The flip-flop proper is constituted by the combination of the switching transistors the bases and collectors of which are cross-coupled. The trigger pulses for the multivibrator are applied to a terminal A which is connected to the bases of the control transistors $T_3$ and $T_4$ via capacitors $C_1$ and $C_2$ respectively. An output signal may be derived from a terminal B connected to the collector of the transistor $T_2$, and a complementary output signal may be derived from a terminal B' connected to the collector of the transistor $T_1$.

The emitter collector path of the pnp auxiliary transistor $T_5$ is connected in parallel with the collector base path of the transistor $T_3$, and the base of the auxiliary transistor is connected to the collector of the transistor $T_2$. Furthermore the emitter collector path of the pnp auxiliary transistor $T_6$ is connected in parallel with the collector base path of the transistor $T_4$, and the base of this auxiliary transistor is connected to the collector of the transistor $T_1$. As has been mentioned hereinbefore, these auxiliary transistors $T_5$ and $T_6$ together with the capacitors have the purpose of preparing a change of state of the multivibrator, as will now be set out more fully.

It is assumed that the multivibrator is in a stable state, the transistor $T_1$ being conducting and the transistor $T_2$ being cut off. The current source $I_2$ then sets up a voltage of about 0.6 volts at the base of the transistor $T_1$ which is in a state of saturation. As a result this voltage of 0.6 volts is also set up at the collector of the transistor $T_6$, because this transistor $T_6$ is conducting, since its emitter base voltage is about 0.6 volts, the base collector voltage of the transistor $T_1$. Hence the base voltage of the transistor $T_4$ also is substantially 0.6 volts. The transistor $T_5$ is cut off, because a voltage of 0.6 volts is set up in the reverse direction across its emitter base path. Consequently the base of the transistor $T_3$ is at a voltage of about 0 volts.

As has been mentioned hereinbefore, there is applied to the trigger input A a pulsatory trigger voltage the two discrete values of which are, for example, 0 volts and 0.3 volts. Assume that in the said stable state of the multivibrator there appears the trailing edge of the trigger pulse preceding the trigger pulse to be applied, so that the voltage at the terminal A becomes 0 volts. A voltage of 0.6 volts then is set up across the capacitor $C_2$, so that this capacitor is charged. No voltage is set up across the capacitor $C_1$, because the base voltage of the transistor $T_3$ also is 0 volts, so that this capacitor $C_1$ is not charged. Assuming the time interval between the said trailing edge and the leading edge of the succeeding trigger pulse to be sufficiently long, on the appearance of this leading edge the capacitor $C_2$ will have been charged to a voltage of about 0.6 volts, whilst the capacitor $C_1$ is not charged. On the appearance of the leading edge of the trigger pulse the voltage at the trigger input A abruptly rises to 0.3 volts. As a result, the base voltage of the transistor $T_4$ abruptly rises to 0.9 volts, so that this transistor $T_4$ becomes highly conducting. The base voltage of the transistor $T_3$ rises to 0.3 volts only, so that this transistor $T_3$ remains cut off. Since the transistor $T_4$ has become highly conducting, its collector voltage and hence the base voltage of the transistor $T_1$ also drop to 0 volts, so that the transistor $T_1$ is cut off, which in turn entails that its collector voltage and hence the base voltage of the transistor $T_2$ rise, so that the latter transistor becomes conducting. Consequently the auxiliary transistor $T_5$ will be conducting and the auxiliary transistor $T_6$ will be cut off. The capacitor $C_2$ will discharge, so that the base voltage of the transistor $T_4$ decreases and this transistor eventually is cut off, and the other stable state of the multivibrator has been reached.

A disadvantage of this known multivibrator circuit is that under certain unfavourable circumstances (worst-case condition) this circuit may be astable. As has been described hereinbefore, the auxiliary transistor $T_5$ is conducting immediately after the multivibrator has changed state, so that the base voltage of the transistor $T_3$ will immediately be about 0.6 volts again. At given unfavourable ratios between the values of the transistor parameters this may cause the transistor $T_3$ to become conducting. As a result, however, the multivibrator will change state at an undesired instant. Obviously, the same applies to the control transistor $T_4$ during the other state of the multivibrator.

A second disadvantage consists in that on the appearance of the leading edge of the trigger pulse a leakage current starts to flow via the auxiliary transistor in the stage which so far has been cut off. In the process of changing state described hereinbefore, the appearance of the trigger pulse causes the base of the control transistor $T_4$ and hence the collector of the auxiliary transistor $T_6$ to become highly positive (0.9 volts). Before the change of state has taken place, the base voltage of this auxiliary transistor is 0 volts, so that the collector base junction of this auxiliary transistor $T_6$ is in the forward direction. Consequently, part of the current supplied by the capacitor $C_2$ and intended for the transistor $T_4$ is conducted away via the collector base path of the transistor $T_6$. It will be clear that this adversely affects the switching speed. Hence, when designing the multivibrator, to reach a given switching speed, with given values of the trigger pulses to be applied, the capacitors $C_1$ and $C_2$ will have to be given higher values than would be necessary without this parasitic effect.

To enable trigger pulses of larger amplitude, for example of 0.6 volts, to be applied to the trigger inputs, the switching transistors $T_1$ and $T_2$ may be expanded to include additional emitters $e'_1$ and $e'_2$ connected to the bases of the control transistors $T_3$ and $T_4$. Otherwise the appearance of a trigger pulse is likely to render both control transistors $T_3$ and $T_4$ conducting owing to the large amplitude of the trigger pulses. Because the additional emitter of the switching transistor in the conducting stage always has a voltage of about 0 volts (this additional emitter effectively acts as a collector), the base voltage of the control transistor in this stage always is 0 volts, until this switching transistor is cut off and the change of state is complete. The behaviour of the control transistor in the cut-off stage is not influenced by this step, so that the stability under adverse conditions is not improved.

FIG. 2 shows a first embodiment of a multivibrator circuit according to the invention, corresponding elements being designated by the same reference numerals as in FIG. 1. The circuits shown in FIGS. 1 and 2 are largely similar. The essential difference is that in the circuit shown in FIG. 2 the bases of the auxiliary transistors $T_5$ and $T_6$ are connected to the trigger input A. This provides better stability and permits smaller capacitors to be used when the circuit is in integrated circuit form, as will now be set out.

We will start again from the stable state in which the transistor $T_1$ is conducting and the transistor $T_2$ is cut off, whilst it is assumed that a trigger pulse of 0.3 volts appears at the trigger input. Thus, the base voltage of the transistor $T_1$ will be about 0.6 volts and the base voltage of the transistor $T_2$ will be about 0 volts again. The auxiliary transistor $T_5$ is cut off, because in this situation a voltage of about 0.3 volts is set up in the reverse direction across its emitter base path. However, unlike the circuit shown in FIG. 1, the auxiliary transistor $T_6$ also is cut off, because a voltage of only about 0.3 volts is set up in the forward direction across its emitter base path, and this voltage is not sufficient to render this transistor conducting. As a result, the collector voltage of the two auxiliary transistors $T_5$ and $T_6$ and hence the base voltages of the two control transistors $T_3$ and $T_4$ also are about 0 volts. This means that the likelihood of an undesired change of stage of the multivibrator is rigorously suppressed, because only an interference voltage in excess of 0.6 volts would be capable of rendering one of the control transistors conducting.

When at the appearance of the trailing edge of the trigger pulse the voltage at the terminal A becomes 0 volts, the auxiliary transistors $T_6$ becomes conducting, because its emitter base voltage then will be 0.6 volts. The base voltage of the control transistor $T_4$ then becomes 0.6 volts, and the capacitor $C_2$ will be charged. On the appearance of the leading edge of the next trigger pulse the base voltage of the transistor $T_4$ abruptly increases, so that this transistor becomes conducting and inititates a change of state of the multivibrator. This involves a further advantage of the circuit shown in FIG. 2. In the known circuit the appearance of the trigger pulse caused a comparatively large voltage (at a maximum 0.9 volts) to be set up in the forward direction across the collector base path of the auxiliary transistor $T_6$, which gave rise to the possibility of a leakage current. In the circuit shown in FIG. 2, there is set up across the collector base path of this transistor the voltage across the capacitor $C_2$ which at a maximum may be 0.6 volts, so that any leakage current which may occur is considerably reduced. Thus, the current from the capacitor $C_2$ is supplied substantially entirely to the base of the transistor $T_4$, so that this capacitor may be given a smaller value than in the circuit shown in FIG. 1.

To permit the use of larger trigger pulses the switching transistors $T_1$ and $T_2$ may again be extended to include additional emitters $e'_1$ and $e'_2$ respectively which again are connected to the base of the control transistors $T_3$ and $T_4$.

FIG. 3 shows a second embodiment of the multivibrator circuit according to the invention. The circuit shown in this Figure is a combination of the circuits shown in FIGS. 1 and 2, combining the advantages of both circuits. Instead of one auxiliary transistor each stage includes the series combination of two auxiliary transistors $T_5$, $T_5'$ and $T_6$, $T_6'$ respectively, which series combinations each shunt the collector base path of the associated control transistors $T_3$ and $T_4$ respectively. The bases of the transistors $T_5$ and $T_6$ are connected to the trigger input A in a manner similar to that shown in FIG. 2, whilst the bases of the transistors $T_5'$ and $T_6'$ are connected to the bases of the switching transistors $T_1$ and $T_2$ in a manner similar to that shown in FIG. 1. The transistors $T_5$ and $T_5'$ and the transistors $T_6$ and $T_6'$ may alternatively be interchanged.

A very important advantage of the multivibrator circuit according to the invention will be apparent when it is fabricated by integrated circuit techniques. FIG. 4 shows by way of example an embodiment of the circuit of FIG. 2 in integrated circuit form.

The semiconductor element shown comprises 3 islands which are separated from one another by p-type island diffusion (dot-dash line). The n-type collector regions of the transistors $T_1$ and $T_3$ fill the island area at the bottom left-hand side, and the collector regions of the transistors $T_2$ and $T_4$ fill the island area at the bottom right-hand side. Within these collector regions lie the base regions, which are p-type regions indicated by dash-dash-lines, with the base contacts $b_1$ to $b_4$ of the transistors $T_1$ to $T_4$. Within these base regions there are in turn provided the n-type emitter regions including the emitter contacts $e_1$ to $e_4$ of the transistors $T_1$ to $T_4$, the additional emitters of the transistors $T_1$ and $T_2$ being obtained by the provision of additional emitter regions having contacts $e'_1$ and $e'_2$ in the base regions of these transistors. The emitter contacts $e_1$ to $e_4$ are connected to the base island diffusion via interconnecting conductors shown shaded and windows $W_1$ to $W_4$, the further interconnections also being established by the conducting paths indicated by shading.

The third island (the top one in the Figure) includes the two lateral pnp transistors $T_5$ and $T_6$, the p-type collector and emitter regions being indicated by solid lines. The structure of the circuit according to the invention has the advantage that the two capacitors $C_1$ and $C_2$ may economically be also included in this island. As FIG. 2 shows, these capacitors shunt the collector base paths of the transistors $T_5$ and $T_6$. This permits these capacitors to be realized by providing an additional $n^+$-type diffusion which extends over parts of the collector and base regions of these transistors $T_5$ and $T_6$, as is shown by the dotted line in FIG. 4. Thus there are produced, between the collector regions and this additional diffusion, pn junctions which have highly capacitive effects and owing to the connection of this additional diffusion to the base regions form capacitors connected in parallel with the collector base paths of the transistors. The $n^+$-type layer is connected to the contact A, which is the trigger input, via an interconnection path. Because the bases of the transistors $T_5$ and $T_6$ are connected to a common point, i.e., the trigger input A, only a single base contact $b_5$, $b_6$ is required, because the active base regions of the transistors $T_5$ and $T_6$ are connected thereto via the low-resistance $n^+$-type layer.

It will be clear that this manner of providing the capacitors in integrated-circuit form saves much space and that this possibility of manufacturing the circuit by integrated circuit techniques is directly due to the structure of the multivibrator circuit according to the invention.

What is claimed is:

1. Bistable multivibrator comprising two stages which each are provided with a switching transistor and a control transistor which are of the same conductivity type and the collector emitter paths of which are connected in parallel, the base of the control transistor of each of the two stages being connected via a capacitive element to a common trigger input of the multivibrator, whilst the base of the switching transistor of each stage is connected to the collector of the switching transistor of the other stage, the collector base path of the control transistor of each of the two stages being shunted by a shunt circuit which includes the emitter collector path of an auxiliary transistor of a conductivity type opposite to that of the switching and control transistors, characterized in that the base of each of the two auxiliary transistors is connected to the trigger input of the multivibrator.

2. Bistable multivibrator as claimed in claim 1, made in integrated-circuit form, characterized in that each of the two auxiliary transistors together with the associated capacitive element is located in one semiconductor island, the capacitive element being obtained by means of an additional region which is of a conductivity type equal to that of the base region of the auxiliary transistor but is more heavily doped and extends both over part of the base region and over part of the collector region of the auxiliary transistor.

3. Bistable multivibrator as claimed in claim 2, characterized in that the two auxiliary transistors together with the two capacitive elements are included in one semiconductor island, the two additional regions being constituted by a single common continuous region.

4. Bistable multivibrator as claimed in claim 1, characterized in that each of the shunt circuits includes in series with the collector emitter path of the auxiliary transistor the collector emitter path of a further transistor of a conductivity type equal to that of the auxiliary transistor, the base of each additional transistor being connected to the collector of the switching transistor in the other stage.

* * * * *